United States Patent [19]

Sugai

[11] 4,107,614
[45] Aug. 15, 1978

[54] MUTING CONTROL CIRCUIT FOR FM RECEIVER

[75] Inventor: Yoshiro Sugai, Kawagoe, Japan

[73] Assignee: Pioneer Electronic Corporation, Tokyo, Japan

[21] Appl. No.: 777,802

[22] Filed: Mar. 15, 1977

[30] Foreign Application Priority Data

Mar. 17, 1976 [JP] Japan ................................. 51/32107

[51] Int. Cl.² ............................................ H04B 1/16
[52] U.S. Cl. ................................. 325/348; 325/402; 325/410; 325/456; 325/478; 358/165
[58] Field of Search ............... 325/348, 402, 403, 410, 325/456, 478, 416, 417, 418, 318, 319, 480; 358/165

[56] References Cited

U.S. PATENT DOCUMENTS

| | | | |
|---|---|---|---|
| 2,546,401 | 3/1951 | Nicholson, Jr. ..................... | 325/456 |
| 2,560,313 | 7/1951 | Tellier ................................. | 325/417 |
| 3,665,320 | 5/1972 | Ohsawa et al. ...................... | 325/478 |
| 3,724,916 | 10/1973 | Merrell ................................. | 325/418 |
| 3,806,818 | 4/1974 | Uchiyama ............................ | 325/478 |
| 3,916,321 | 10/1975 | Morse ................................. | 325/478 |

Primary Examiner—John C. Martin
Assistant Examiner—Tommy P. Chin
Attorney, Agent, or Firm—Sughrue, Rothwell, Mion, Zinn and Macpeak

[57] ABSTRACT

A muting control circuit for an FM receiver provides rapid on-off response during channel selection or tuning, and rapid on but delayed off response during listening, whereby annoying muting circuit switching is reduced. The delay is implemented by rapidly charging a capacitor when the muting is switched on, and then allowing the relatively slower discharge of the capacitor to prolong the muting operation after the control signal therefore is terminated.

4 Claims, 2 Drawing Figures

MUTING CONTROL CIRCUIT FOR FM RECEIVER

BACKGROUND OF THE INVENTION

The present invention relates to a muting control circuit for an FM receiver for relieving interference produced by local noises and/or noise due to a weak electrical reception field.

A muting circuit is operable where the level of a receiver input signal is lower than desired to prevent local noises and/or noise produced by a weak electrical field from occurring. Where the electric field strength is around the desired level, however, the operation of the conventional muting circuit involves frequent on and off switching in response to small changes in the field strength, thus causing an uncomfortable and annoying audio output. This phenomenon is particularly noticeable in receivers mounted on vehicles, especially when the vehicle drives through a city area.

SUMMARY OF THE INVENTION

An object of the present invention is to resolve the above problem by providing a muting circuit for an FM receiver wherein station or channel selection is facilitated by providing a fast response at both the commencement and termination of the muting operation, and during normal listening conditions over a tuned station good reception is established by providing a fast response at the commencement of the muting operation and a slow response at the termination thereof.

DETAILED DESCRIPTION OF THE PREFERRED EMBODIMENTS

Figure 1:
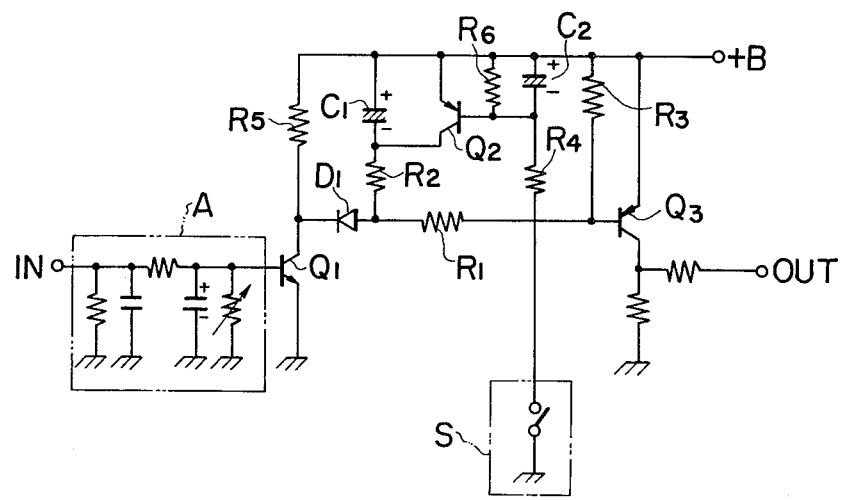
FIG. 1 shows a schematic diagram of a muting circuit for an FM receiver according to the present invention.

Referring to FIG. 1, a d.c. signal whose magnitude is inversely proportional to the antenna input level is applied to input terminal IN. This d.c. signal may be derived, for example, by inverting the detection signal taken from an IF amplifier stage of the FM receiver.

A transistor $Q_1$ has a predetermined conduction threshold level with respect to the d.c. signal applied to the input terminal IN, and is switched on and off in response to such d.c. signal. The threshold level is determined by the base-emitter voltage $V_{BE}$ of transistor $Q_1$. A diode $D_1$ has its cathode connected to the collector of transistor $Q_1$, and is adapted to block any reverse current. Diode $D_1$ becomes conductive when transistor $Q_1$ is turned on. A capacitor $C_1$ having one terminal connected through a resistor $R_5$ to the cathode of diode $D_1$ and the other terminal connected through a resistor $R_2$ to the anode of $D_1$ is rapidly charged through resistor $R_2$ when transistor $Q_1$ is turned on and relatively slowly discharged when $Q_1$ is turned off in accordance with a time constant determined by the values of resistors $R_1$, $R_2$ and $R_3$. A switch S is closed only during channel selection or station tuning, and serves to ground the base of a transistor $Q_2$, whose function will be described later. When switch S is closed transistor $Q_2$ remains non-conductive for a short time depending upon the time constant determined by the values of capacitor $C_2$ and resistor $R_4$. As soon as $C_2$ becomes charged $Q_2$ turns on, whereby the capacitor $C_1$ is rapidly discharged. When switch S is opened, $Q_2$ remains either conductive or enabled for a short time, until $C_2$ discharges through $R_6$. A transistor $Q_3$ is turned on when transistor $Q_1$ is turned on, which in turn charges capacitor $C_1$ through resistor $R_2$. When transistor $Q_1$ is turned off, transistor $Q_3$ turns off after capacitor $C_1$ discharges. A signal for controlling the start and stop of the muting operation is thus produced at the output terminal OUT in response to the on-off switching of transistor $Q_3$. Such control signal may be applied for example, to a relay circuit or to a switching circuit for controlling a relay circuit.

An integration circuit A is connected between the input terminal IN and the base of transistor $Q_1$ for damping out the high frequency components of the alternating portion of the d.c. signal.

In operation, the switch S is closed during channel selection or tuning whereby transistor $Q_2$ is turned on to short-circuit and discharge capacitor $C_1$, to thereby establish an operational mode for transistor $Q_3$ in which the latter is immediately responsive to the on-off switching of transistor $Q_1$. Accordingly, the receiver operates in a rapid response muting mode during the channel selection period, as when the tuner section is between stations, and when the receiver is tuned to a strong channel the muting operation is immediately terminated. This results in facilitated channel selection.

During the signal receiving or listening period, the switch S is open whereby transistor $Q_2$ remains cutoff. Therefore, when the muting operation commences during the signal receiving period, transistor $Q_3$ is immediately responsive to the turning on of transistor $Q_1$ and when the muting operation termination is initiated by the turning off of transistor $Q_1$, transistor $Q_3$ remains conductive for a delay period determined by the time constant of capacitor $C_1$ in combination with resistors $R_1$, $R_2$ and $R_3$. Accordingly, even if the electrical field strength is weak whereby the level of the d.c. input signal applied to the terminal IN hovers around the threshold level, the muting operation is immediately started in response to a decrease in the field strength and continues temporarily even after the field strength rises above the threshold level. In this manner the frequent on-off switching of the muting operation is eliminated, which results in more stable reception conditions.

Figure 2:
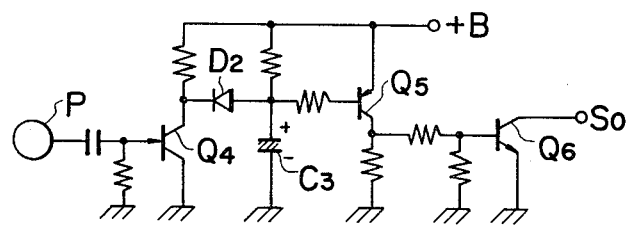
FIG. 2 shows a schematic diagram of the switch S in FIG. 1 for sensing when the receiver is being tuned.

FIG. 2 shows a circuit diagram for the switch S in FIG. 1, wherein the switch S is a "touch-switch" which functions to ground the output terminal $S_0$ whenever the operator touches the channel selection knob P.

The "touch-switch" comprises, fundamentally, an FET $Q_4$ and a pair of transistors $Q_5$ and $Q_6$. When the operator touches the knob P a minute alternating electrical signal induced in the body of the operator is applied to the gate of the FET $Q_4$ to render the latter conductive, which causes the capacitor $C_3$ to discharge through the diode $D_2$. This in turn renders transistors $Q_5$ and $Q_6$ simultaneously conductive, which grounds the output or switch terminal $S_0$. By employing such a "touch-switch" the transistor $Q_2$ in FIG. 1 is automatically turned on when the operator touches the tuning knob of the receiver.

What is claimed is:

1. In a muting control circuit for an FM receiver including first switch means for detecting when the magnitude of a received FM signal falls below a predetermined threshold level, and second switch means for generating a muting control signal in rapid response to the first means, the improvement characterized by:

(a) means for delaying the turn-off response of the second switch means,
(b) means for detecting the performance of a station selection or tuning operation in the receiver, and
(c) means for disabling the delay means in response to the performance detecting means.

2. A muting control circuit as defined in claim 1, wherein the delay means comprises a capacitor, a rapid charging circuit for the capacitor including the first switch means, and a relatively slower discharge circuit for the capacitor, said discharge circuit being connected to a control terminal of the second switch means.

3. A muting control circuit as defined in claim 2, wherein the disabling means comprises third switch means connected across the capacitor for discharging said capacitor in response to the performance detecting means.

4. A muting control circuit as defined in claim 3, wherein the performance detecting means comprises a touch-switch adapted to be closed in response to the engagement of a tuning knob of the receiver by the operator thereof, and wherein the third switch means is closed in response to the closure of the touch-switch.

* * * * *